United States Patent [19]

Wu

[11] Patent Number: 5,937,281

[45] Date of Patent: Aug. 10, 1999

[54] METHOD TO FORM METAL-TO-METAL ANTIFUSE FOR FIELD PROGRAMMABLE GATE ARRAY APPLICATIONS USING LIQUID PHASE DEPOSITION (LPD)

[75] Inventor: Shye-Lin Wu, Hsinchu, Taiwan

[73] Assignee: Powerchip Semiconductor, Corp., Hsinchu, Taiwan

[21] Appl. No.: 08/906,552

[22] Filed: Aug. 5, 1997

[51] Int. Cl.[6] .................................................. H01L 21/82
[52] U.S. Cl. ........................... 438/131; 438/600; 257/50; 257/530
[58] Field of Search .................................. 438/131, 600; 257/50, 530

[56] References Cited

U.S. PATENT DOCUMENTS

| | | | |
|---|---|---|---|
| 5,427,979 | 6/1995 | Chang ..................................... | 438/600 |
| 5,472,902 | 12/1995 | Lur ......................................... | 438/407 |
| 5,493,146 | 2/1996 | Pramanik et al. ...................... | 257/530 |
| 5,519,248 | 5/1996 | Yan et al. .............................. | 257/530 |
| 5,565,703 | 10/1996 | Chang .................................... | 257/530 |
| 5,573,971 | 11/1996 | Cleeves .................................. | 438/600 |
| 5,592,016 | 1/1997 | Go et al. ................................ | 257/530 |
| 5,614,756 | 3/1997 | Forouhi et al. ........................ | 257/530 |
| 5,639,684 | 6/1997 | Kwok ..................................... | 438/600 |
| 5,693,556 | 12/1997 | Cleeves .................................. | 438/600 |
| 5,714,795 | 2/1998 | Ohmi et al. ............................ | 257/530 |
| 5,831,325 | 11/1998 | Zhang .................................... | 257/530 |

Primary Examiner—John F. Niebling
Assistant Examiner—Lynne A. Gurley
Attorney, Agent, or Firm—Raymond Sun

[57] ABSTRACT

A method of fabricating an antifuse structure for field programmable gate array (FPGA) applications is described. First, a field oxide layer for isolation is grown on the semiconductor silicon substrate. Then, a bottom electrode, a thin dielectric layer and a first top electrode layer are sequentially deposited on the surface of the field oxide layer. Next, a photoresist layer is coated on the surface of the first top electrode layer. Then, the first top electrode layer is patterned to form a top electrode stud. Next, a layer of silicon dioxide ($SiO_2$) is deposited by Liquid Phase Deposition (LPD) to improve the overall profile of the antifuse structure. Thereafter, the photoresist pattern is removed. Next, a second top electrode layer is deposited overlaying the LPD-$SiO_2$ layer and the top electrode stud. The top electrode that consists of the second top electrode layer and the top electrode stud is completed. The antifuse structure of FPGAs is accomplished.

11 Claims, 3 Drawing Sheets

METHOD TO FORM METAL-TO-METAL ANTIFUSE FOR FIELD PROGRAMMABLE GATE ARRAY APPLICATIONS USING LIQUID PHASE DEPOSITION (LPD)

BACKGROUND OF THE INVENTION (1) Field of the Invention

The present invention relates to a method of fabricating the field programmable gate arrays (FPGAs), and more particularly to the novel antifuse structure of high density and high speed FPGAs.

(2) Description of the Related Art

Gate arrays are largely a matrix of integrated circuit structures, such as logic gates and their associated input and output structures which are isolated from one another. These logic gates are overlaid with vertical and horizontal wiring channels, which interconnect the logic gates and input and output structures in a pattern to perform a user-specified function.

Field programmable gate arrays (FPGAs) offer important improvement in turn around time and eliminate non-recurring engineering cost for application specific integrated circuit (ASIC) prototype compared to traditional mask-programmable gate arrays (MPGAs). In a field programmable gate array, the connections between transistors, logic blocks, and input and output circuits are made by interconnect elements. There are three types of the interconnect elements currently in use. A MOSFET is either on or off depending on the state of an accompanying static random access memory (SRAM) cell. The program information is volatile and must be stored elsewhere and rebooted at power-up. EPROM or flash memory, of course, also controls the MOSFET; it can also serve as the interconnect element itself. An antifuse is made of an insulating layer sandwiched by two electrodes. The interconnect element is normally off until a programming voltage/current pulse breaks down the insulator and turns it into a low-value resistor. Numerous antifuse materials and structures have been employed in the past. For example, see U.S. Pat. No. 5,493,147 to Holzworth et al., U.S. Pat. No. 5,537,056 to McCollum, and U.S. Pat. No. 5,557,136 to Gorden et al. (the entire disclosures of which are herein incorporated by reference). Dielectric based antifuses with Si bottom electrodes and amorphous silicon ($\alpha$-Si) dielectric layer with TiW metal top electrodes are now used in FPGAs.

Referring now to FIG. 1, it illustrates a cross sectional view of the conventional antifuse structure. First, a field oxide layer 3 for isolation is formed on a silicon substrate 1. A layer of bottom electrode 5 which is typically made of doped silicon or TiW alloy is formed on the field oxide layer 3. A dielectric layer 7 such as 2000 Angstroms of CVD oxide is formed over bottom electrode and then masked and etched to define an antifuse via opening. Next, a thin dielectric layer 9 such as $\alpha$-Si or oxide/nitride/oxide (ONO) is deposited. Finally, a top electrode 11 is formed overlaying the dielectric layer to complete the formation of an antifuse structure of FPGAs.

As the via sizes of the IC devices become smaller, there is always the concern of step coverage problem. The issue of poor step coverage of the dielectric layer creates weak points 13 that affects the reliability of the antifuses. Besides, the non-uniform thicknesses of the dielectric layer and top electrode in the concave area further degrade the performance of the field programmable gate arrays.

To solve the above-mentioned problems, the present invention provides a method of making an antifuse structure of the FPGA device by the assisting of liquid phase deposition (LPD) oxide, which is capable of providing better step coverage in the dielectric layer/ electrodes interfaces of the antifuse structure.

The liquid phase deposition (LPD) is a newly developed technology, which can be used to grow silicon dioxide in an aqueous solution at low temperature. Having the features of selective deposition against photoresist and conformal growth, the silicon dioxide prepared by LPD can be utilized to simplify the antifuse process and improve the uniformity of the dielectric layer. Liquid phase deposition of silicon dioxide is described in the article entitled "A Selective $SiO_2$ Film-Formation Technology Using Liquid-Phase Deposition for Fully Planarized Multilevel Interconnects," J. Electrochem. Soc., Vol. 140, No. 8, August 1993, which is fully incorporated by reference.

Within the prior art, there are some references addressing different applications of liquid phase oxide deposition. However, none appear to be directed to the specific application of the present invention, namely the use of the phase liquid oxide deposition to simplify the antifuse process in making a FPGA. For example, U.S. Pat. No. 5,470,681 to Brunner et al. provides an improved phase shift mask structure for making lithographic exposures by selective deposition of oxide through openings in a pattern of polyimide or similar organic material. U.S. Pat. No. 5,472,898 to Hong et al. utilizes a silicon dioxide formed by liquid phase deposition in making a mask read only memory (ROM). U.S. Pat. No. 5,472,902 to Lur discloses a method of forming an isolation structure on a silicon substrate having a silicon-on-insulator (SOI) structure.

SUMMARY OF THE INVENTION

Accordingly, it is a primary object of the present invention to provide a novel antifuse structure for FPGA applications.

It is another object of the present invention to provide a novel antifuse structure improving the uniformity of the dielectric layer and top electrode of the antifuse structure.

It is yet another object of the present invention to provide a novel antifuse structure without the concern of the step coverage issue in the dielectric deposition.

It is a further object of the present invention to provide a method of fabricating the antifuse structure which can improve the performance and reliability of the FPGAs.

It is yet a further object of the present invention to provide a method of fabricating the antifuse structure which can increase the density and speed for FPGA applications.

These objects are accomplished by the fabrication process described below.

First, a field oxide layer for isolation is grown on the semiconductor silicon substrate by standard integrated circuit fabrication process. Then, a bottom electrode, a thin dielectric layer and a first top electrode layer are sequentially deposited on the surface of the field oxide layer.

Next, a photoresist layer is coated on the surface of the first top electrode layer. Then, the first top electrode layer is patterned to form a top electrode stud by the conventional lithography and etching techniques.

The next step is the key point of the present invention. With the help of the photoresist mask shielding the top electrode stud, a layer of silicon dioxide ($SiO_2$) is deposited to a vertical thickness the same as the top electrode stud. Having the features of selective deposition against photoresist and conformal growth, the silicon dioxide prepared by LPD can be utilized to improve the overall profile of the antifuse structure. Thereafter, the photoresist pattern is removed.

Next, a second top electrode layer is deposited overlaying the LPD-SiO$_2$ layer and the top electrode stud. The top electrode that consists of the second top electrode layer and the top electrode stud is completed, and therefore, the novel antifuse structure of FPGAs with the assist of the LPD-SiO$_2$ layer according to the present is finally accomplished.

BRIEF DESCRIPTION OF THE DRAWINGS

The accompanying drawings form a material part of this description, in which:

FIG. 2 is a cross sectional representation of the antifuse structure after the bottom electrode, dielectric layer and top electrode are successively formed.

FIG. 3 is a cross sectional representation of the antifuse structure after the top electrode pattern is defined.

FIG. 4 is a cross sectional representation of the antifuse structure after the LPD oxide layer is deposited.

FIG. 5 is a cross sectional representation of the antifuse structure after the final structure is completed.

DESCRIPTION OF THE PREFERRED EMBODIMENT

Figure 1:
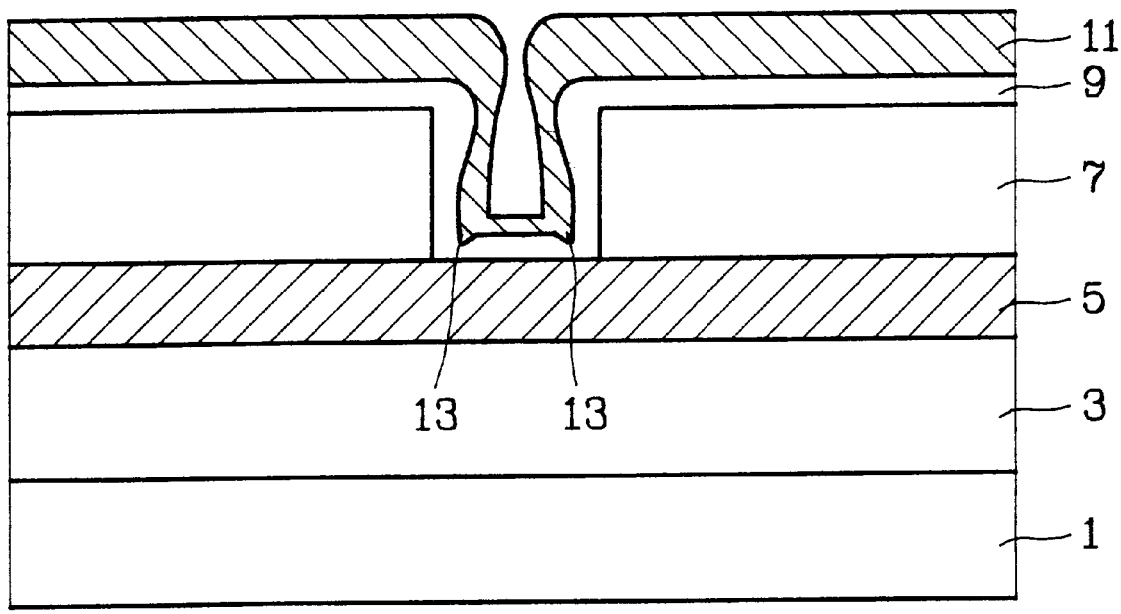
FIG. 1 is a cross sectional representation of the antifuse structure according to the prior art.

The invention disclosed herein is directed to a method of fabricating the antifuse structure of high density and high speed FPGAs. The drawing figures illustrate a partially completed integrated circuit device. In the following description, numerous details are set forth in order to provide a thorough understanding of the present invention. It will be appreciated by one skilled in the art that variations of these specific details are possible while still achieving the results of the present invention. In other words well-known processing steps are not described in detail in order not to unnecessarily obscure the present invention.

Figure 2:
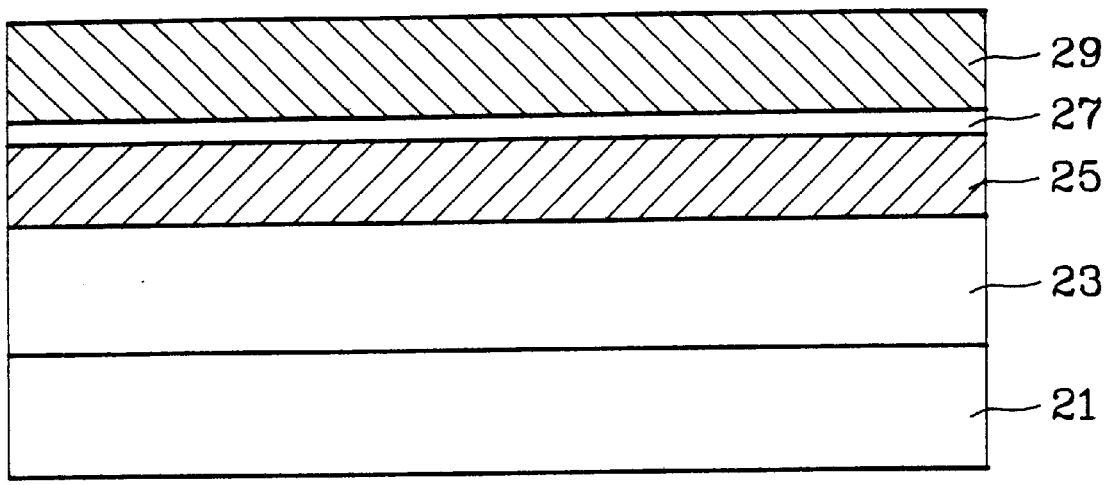
FIGS. 2 through 5 schematically illustrate the cross sectional view of the antifuse structure according to the present invention.

Referring now more particularly to FIG. 2, there is shown a portion of a partially completed antifuse structure of the FPGAs. For simplicity, FIG. 2 only shows the antifuse portion of a FPGA which is fabricated on a semiconductor silicon substrate 21. First, a layer of field oxide 23 for isolation is grown on the semiconductor silicon substrate 21. Next, a bottom electrode 25, a thin antifuse dielectric layer 27 and a first top electrode layer 29 are successively formed overlaying the field oxide layer 23.

The field oxide growth technology is well known in the prior art and is therefore not described in details. For example, U.S. Pat. No. 3,970,486 to E. Kooi, the entire disclosure of which are herein incorporated by reference, discloses the local oxidation (LOCOS) technique which teaches a method to grow thermal oxide layer outside the nitride mask against oxidation on a silicon substrate. The thickness of the field oxide layer 23 is about 3000 to 6000 Angstroms. The bottom electrode 25 is typically made of a barrier metal such as titanium tungsten (TiW) deposited by sputtering, to a thickness about 1000 to 3000 Angstroms. Other conductive materials, for example, metal, silicon, polysilicon or suicide may also be used.

The antifuse dielectric layer 27 is usually made of amorphous silicon (α-Si) by RF sputtering method with phosphorus doping or by low pressure chemical vapor deposition (LPCVD) technique under the following conditions: the temperature is about 250° C. to 580° C., the pressure is about 0.25 Torr, with SiH$_4$ reactant gas. Amorphous silicon formation by PECVD is described in A. C. Adams, "Plasma Deposition of Inorganic Films", Solid State Technology, April 1983, pp. 135–139, hereby incorporated entire disclosure by reference. Alternatively, silicon nitride (SiN$_x$) deposited by PECVD technique at a temperature of 250° C. to 400° C. or by CVD technique at a temperature of 250° C. to 400° C. can also serve as the antifuse dielectric layer. Other dielectric materials, for example, conventional ONO sandwich structure, newly developed tantalum oxide (Ta$_2$O$_5$), barium strontium titanium (BST), or lead zirconium titanium (PZT) may also be used. The thickness of the antifuse dielectric layer is about 50 to 200 Angstroms, depending on the material used. The top electrode 29 is typically made of titanium tungsten (TiW) deposited by sputtering or polysilicon deposited by PECVD technique, to a thickness about 1000 to 3000 Angstroms.

Figure 3:
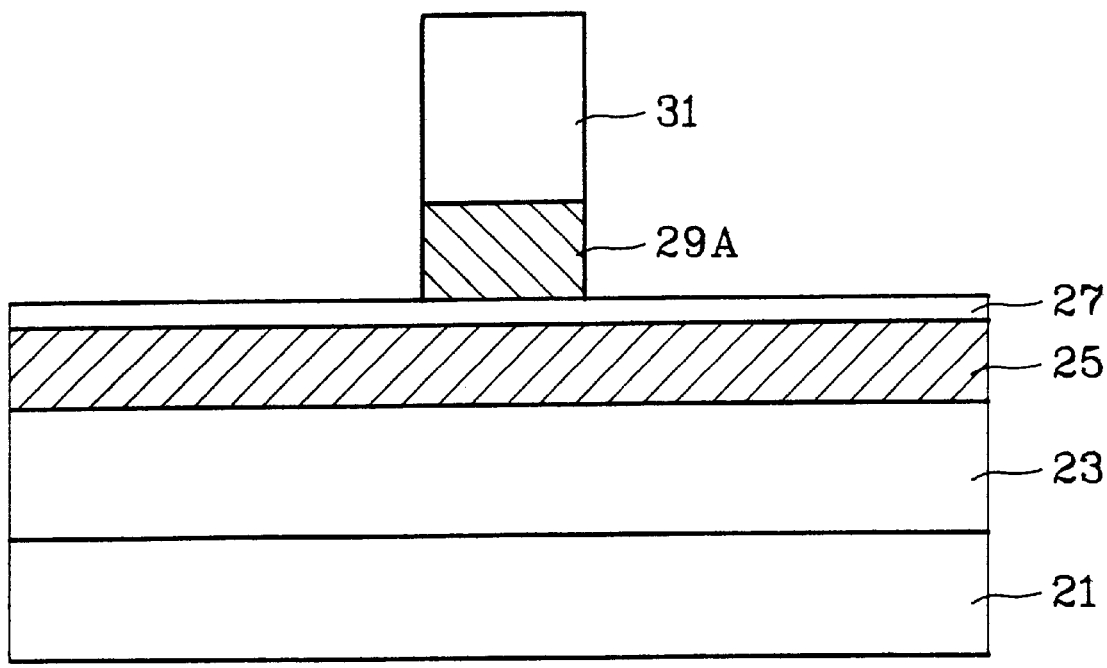

Referring now to FIG. 3, a photoresist layer 31 is coated on the surface of the top electrode. Then, the top electrode is patterned to form a top electrode stud 29A by the conventional lithography and etching techniques. The etching process can use anisotropically plasma-etching such as magnetic enhanced reactive ion etching (MERIE), electron cyclotron etching (ECR), or the conventional reactive ion etching (RIE) methods. In sub-micron VLSI device technology, it usually uses the MERIE method by a plasma-etcher such as a Lam Research Inc. Model Rainbow 4520 with reactant gases SF$_6$ and O$_2$. Alternatively, the etching process can use wet etching in a mixture of solutions NH$_4$OH, H$_2$O, and H$_2$O$_2$, in a ratio of 1:12:5 for about 20 minutes at a temperature between about 30 to 50° C.

Figure 4:
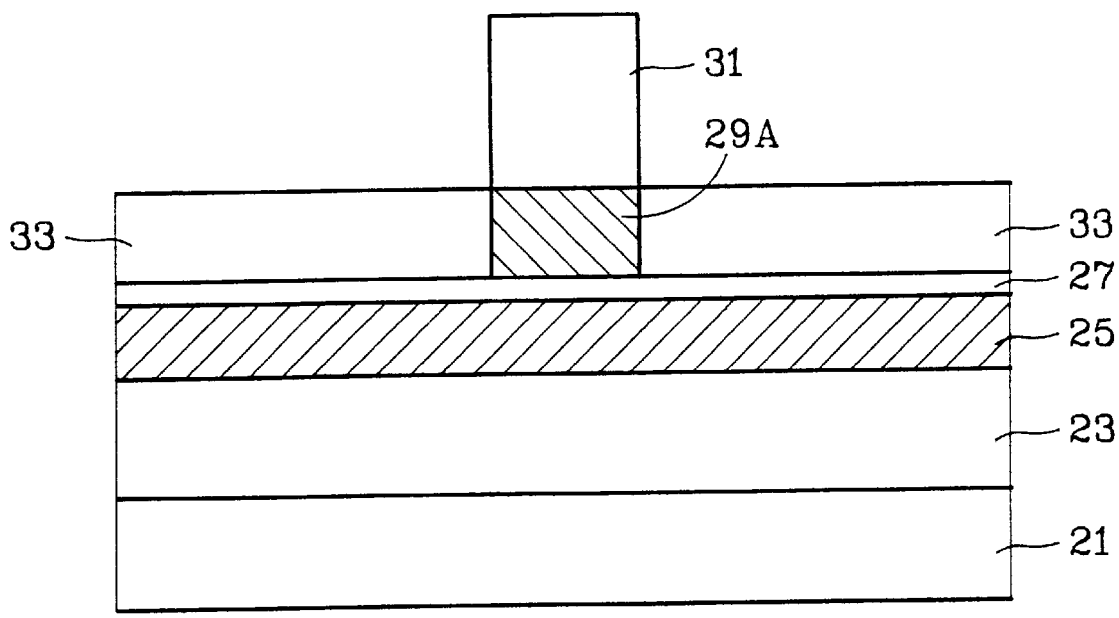

Referring now to FIG. 4, this step is the key point of the present invention. With the photoresist mask 31 shielding the top electrode stud 29A, a layer of silicon dioxide (SiO$_2$) 33 with a thickness of about 1000 to 4000 Angstroms is formed by liquid phase deposition, which is referred as the LPD-SiO$_2$ layer. Having the features of selective deposition against photoresist and conformal growth, the silicon dioxide prepared by LPD can be utilized to improve the overall profile of the antifuse structure. Thereafter, the photoresist pattern 31 is stripped by oxygen plasma or sulfuric acid.

The LPD-SiO$_2$ layer 33 can be deposited by immersing the silicon substrate 21 into the supersaturated hydrofluorosilicic acid (H$_2$SiF$_6$) solution with silica-gel. The chemical reaction is a reversible one which is shown in equation (1):

$$H_2SiF_6 + 2H_2O \leftrightarrow 6HF + SiO_2\downarrow \tag{1}$$

In the equation (1), the addition of SiO$_2$ (silica-gel) leads to a shift from right toward left. Therefore, the SiO$_2$ saturated hydrofluorosilicic acid solution may include hydrofluoric acid (HF) which is minimized in the equation (1).

However, this equilibrium can be changed by the addition of boric acid or aluminum to the solution, whose reaction equations are shown in the following:

$$H_3BO_3 + 4HF \leftrightarrow BF_4^- + H_3O^+ + 2H_2O \tag{2}$$

$$2Al + 12HF \leftrightarrow 6H_3AlF_6 + 3H_2 \tag{3}$$

Accordingly, the addition of boric acid or aluminum to the solution shifts the equilibrium process (1) from left toward right and helps the SiO$_2$ to deposit.

Figure 5:
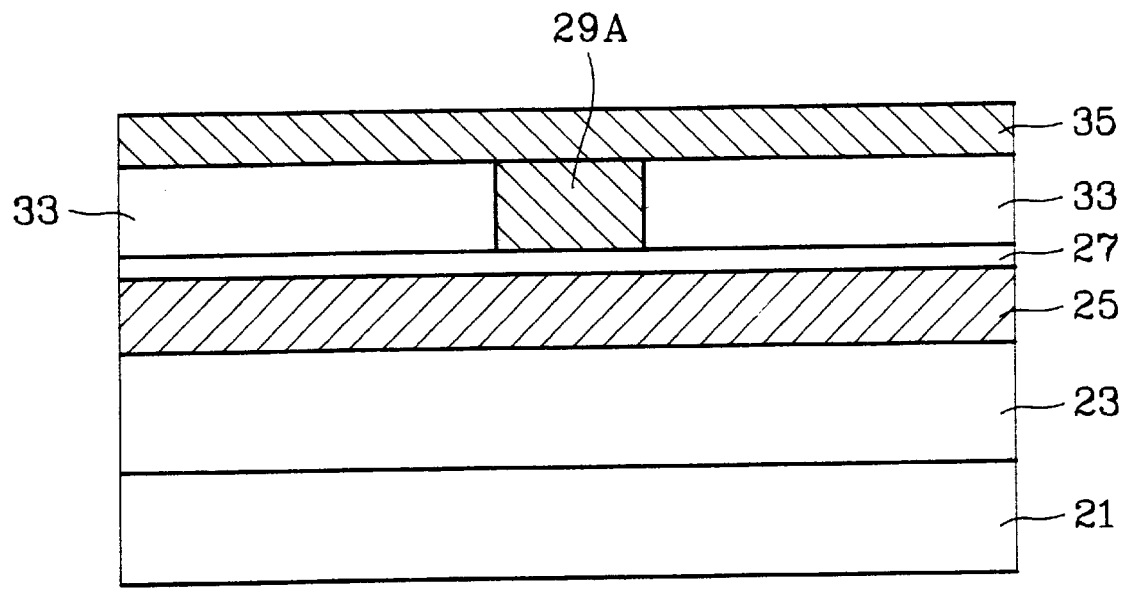

Referring now to FIG. 5, a second top electrode layer 35 is deposited overlaying the LPD-SiO$_2$ layer 33 and the top electrode stud 29A by the same method as described before, to a thickness about 1000 to 2000 Angstroms. The top electrode that consists of the second top electrode layer 35 and the top electrode stud 29A is completed, and therefore, the novel antifuse structure of FPGAs with the assist of the LPD-SiO$_2$ layer according to the present is finally accomplished.

The novel antifuse structure of FPGAs of the present invention has uniform thicknesses of the dielectric layer and top electrode that can improve the yield and performance of the FPGAs as well as achieve high density and high speed field programmable gate array applications.

While the invention has been particularly shown and described with reference to a preferred embodiment, it will be understood by those skilled in the art that various changes in form and detail may be made therein without departing from the spirit and scope of the present invention.

What is claimed is:

1. A method of fabricating at least one antifuse structure of a semiconductor memory device cell, comprising the steps of:

(a) forming a field oxide layer on a semiconductor substrate said field oxide layer having a surface;

(b) sequentially forming a bottom electrode, an antifuse dielectric layer and a top electrode overlaying the surface of said field oxide layer;

(c) partially etching said top electrode to form at least one top electrode stud by conventional lithography and etching techniques so as to leave a top surface of said antifuse dielectric layer exposed, each said top electrode stud having a thickness;

(d) forming a liquid phase deposition (LPD) silicon dioxide layer overlaying said said exposed top surface to said dielectric layer to a thickness the same as said top electrode stud thickness; and (e) forming a second top electrode layer overlaying said top electrode stud and said LPD silicon dioxide layer.

2. The method of claim 1, wherein said semiconductor memory device is a field programmable gate array (FPGA).

3. The method of claim 1, wherein said bottom electrode is titanium tungsten (TiW).

4. The method of claim 3, wherein said bottom electrode has a thickness of 1000 to 3000 Angstroms.

5. The method of claim 1, wherein said bottom electrode is selected from the group consisting of metal, silicon, polysilicon, and silicide.

6. The method of claim 1, wherein said antifuse dielectric layer has a thickness of 50 to 200 Angstroms.

7. The method of claim 6, wherein said antifuse dielectric layer is selected from the group consisting of amorphous silicon, ONO, silicon nitride (SiN$_x$), tantalum oxide (Ta$_2$O$_5$), BST and PZT.

8. The method as claim 1, wherein said liquid phase deposition (LPD) silicon dioxide layer is formed by:

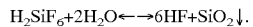

9. The method as claim 8, which further comprises the step of: adding boric acid (H$_3$BO$_3$) or aluminum to the reaction solution of said liquid phase deposition to help the SiO$_2$ to deposit.

10. The method of claim 1, wherein said top electrode is selected from the group consisting of titanium tungsten (TiW), and polysilicon.

11. The method of claim 1, wherein said top electrode stud has a thickness of about 1000 to 3000 Angstroms.

* * * * *